United States Patent
Hill et al.

(10) Patent No.: US 8,609,538 B2
(45) Date of Patent: Dec. 17, 2013

(54) METHODS RELATING TO THE FABRICATION OF DEVICES HAVING CONDUCTIVE SUBSTRATE VIAS WITH CATCH-PAD ETCH-STOPS

(71) Applicants: Darrell G. Hill, Tempe, AZ (US); Bruce M. Green, Gilbert, AZ (US)

(72) Inventors: Darrell G. Hill, Tempe, AZ (US); Bruce M. Green, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/764,398

(22) Filed: Feb. 11, 2013

(65) Prior Publication Data
US 2013/0157456 A1 Jun. 20, 2013

Related U.S. Application Data

(62) Division of application No. 13/005,240, filed on Jan. 12, 2011, now Pat. No. 8,410,580.

(51) Int. Cl.
*H01L 21/44* (2006.01)

(52) U.S. Cl.
USPC .................................. 438/667; 257/E21.597

(58) Field of Classification Search
USPC .......................................... 438/668, 671, 928
See application file for complete search history.

(56) References Cited

U.S. PATENT DOCUMENTS

| | | | | |
|---|---|---|---|---|
| 5,767,001 A | * | 6/1998 | Bertagnolli et al. | 438/455 |
| 6,664,129 B2 | * | 12/2003 | Siniaguine | 438/107 |
| 7,119,399 B2 | | 10/2006 | Ma et al. | |
| 7,125,786 B2 | | 10/2006 | Ring et al. | |
| 7,816,227 B2 | * | 10/2010 | Chen et al. | 438/667 |

FOREIGN PATENT DOCUMENTS

EP 2088619 A1 2/2009

OTHER PUBLICATIONS

Green, B..M., et al., "A GaN HFET Device Technology on 3" SiC Substrates for Wireless Infrastructure Applications," IEEE, May 2006.
Green, B..M., et al., "Characterization and Thermal Analysis of a 48V GaN HFET Technology for Wireless Infrastructure Applications", IEEE, Mar. 2008.

* cited by examiner

*Primary Examiner* — Chandra Chaudhari
(74) *Attorney, Agent, or Firm* — Ingrassia Fisher & Lorenz, P.C.

(57) ABSTRACT

An electronic device having a conductive substrate via extending between a conductor on a rear face and a conductor over a front face of the substrate includes a multi-layered etch-stop beneath the front surface conductor. The etch-stop permits use of a single etchant to penetrate both the substrate and any overlying semiconductor and/or dielectric without attacking the overlying front surface conductor. This is especially important when the semiconductor and dielectric are so thin as to preclude changing etchants when these regions are reached during etching. The etch-stop is preferably a stack of $N \geq 2$ pairs of sub-layers, where a first sub-layer comprises stress relieving and/or adhesion promoting material (e.g., Ti), and the second sub-layer comprises etch resistant material (e.g., Ni). In a further embodiment, where the device includes field effect transistors having feedback sensitive control gates, the etch-stop material is advantageously used to form gate shields.

20 Claims, 8 Drawing Sheets

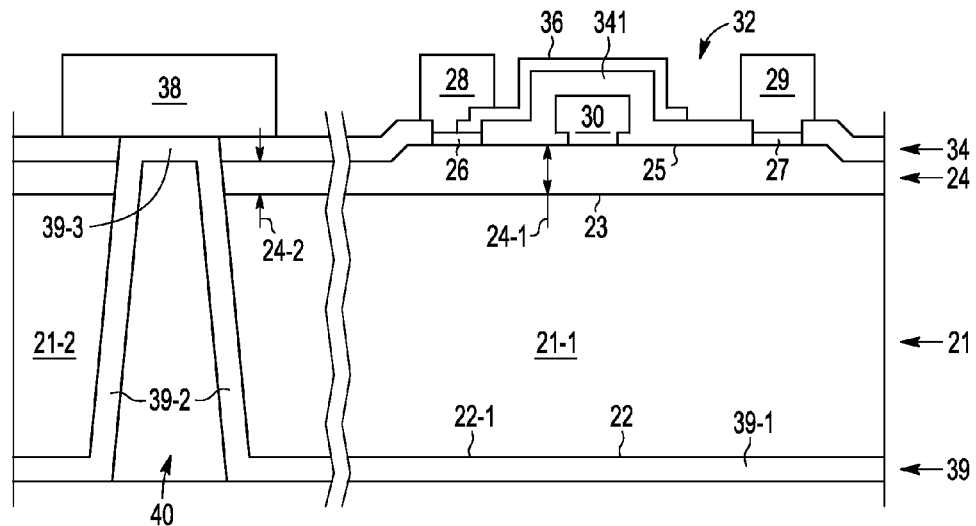
FIG. 1  20
- PRIOR ART -
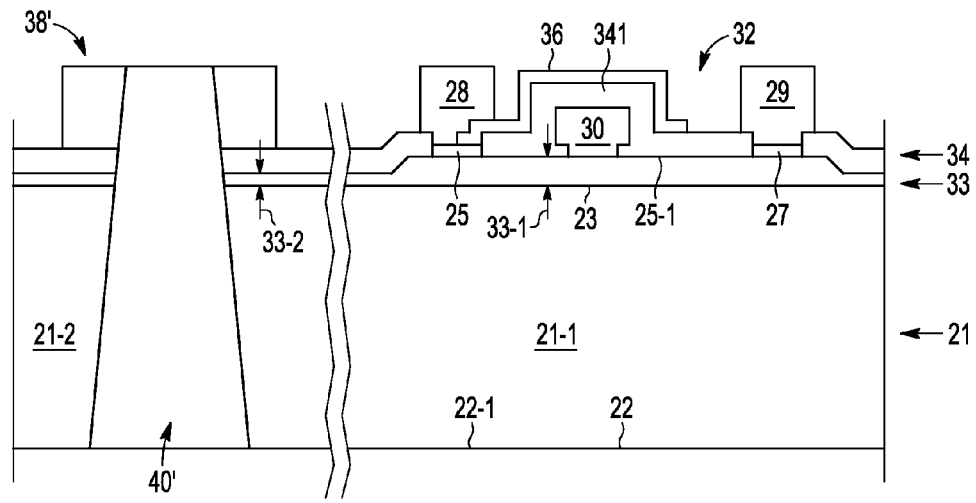
FIG. 2  20'

METHODS RELATING TO THE FABRICATION OF DEVICES HAVING CONDUCTIVE SUBSTRATE VIAS WITH CATCH-PAD ETCH-STOPS

CROSS-REFERENCE TO RELATED APPLICATION

This application is a divisional of co-pending U.S. application Ser. No. 13/005,240, filed Jan. 12, 2011.

FIELD OF THE INVENTION

The present invention generally relates to semiconductor devices and circuits and methods for fabricating semiconductor devices and circuits, and more particularly relates to semiconductor devices and circuits embodying through-wafer vias.

BACKGROUND OF THE INVENTION

Through-wafer vias are widely used in modern electronic devices and integrated circuits (ICs). Typically such vias are filled or lined with a conductor thereby providing a low resistance connection from the front side of the device or IC where the active regions are often located to the back side of the device or IC where it is intended to be bonded to a support, heat sink, ground plane or higher level circuit. As devices and ICs become smaller or operate at higher frequencies or utilize various non-type IV semiconductors for the active devices, it can become more difficult to efficiently and economically provide such through-substrate vias. This is especially of concern when III-IV semiconductors are used for the active devices and it is further desired to use other materials, such as for example silicon carbide, as substrates on which the device or IC is formed. Accordingly, a need continues to exist for improved device structures and methods of manufacture for providing through-substrate vias in semiconductor (SC) devices and ICs employing these and other materials.

BRIEF DESCRIPTION OF THE DRAWINGS

The present invention will hereinafter be described in conjunction with the following drawing figures, wherein like numerals denote like elements, and wherein:

FIG. 1 shows a simplified cross-sectional view of a semiconductor device employing a through-substrate via, according to the prior art;

FIG. 2 shows a simplified cross-sectional view of a modified version of the device of FIG. 1 during manufacturing, showing how such modification can cause manufacturing failure;

DETAILED DESCRIPTION OF THE INVENTION

Figure 3:
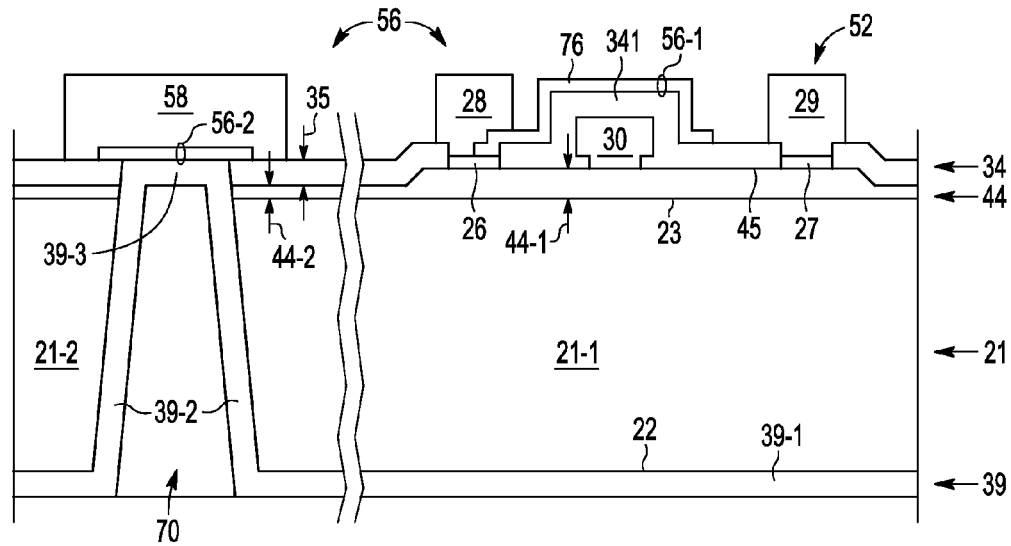
FIG. 3 shows a simplified cross-sectional view of an improved semiconductor device employing a through-substrate via, according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "SC substrate" are intended to include single crystal structures, polycrystalline structures, amorphous structures, thin film structures, layered structures as for example and not intended to be limiting, semiconductor-on-insulator (SOI) structures, and combinations thereof.

For convenience of explanation and not intended to be limiting, semiconductor (SC) devices and methods of fabrication are described herein for gallium-nitride (GaN) semiconductors and silicon carbide (SiC) substrates, but persons of skill in the art will understand that other semiconductor materials and substrates may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second, opposite type is then either P or N type. Various embodiments of the invention will be illustrated for field-effect transistors (FETs), as for example junction field-effect transistors (JFETs), but this is merely for convenience of description and is not intended to be limiting.

FIG. 1 shows a simplified cross-sectional view of semiconductor device 20 employing through-substrate via (TSV) 40, according to the prior art. Device 20 comprises substrate 21, for example of silicon carbide (SiC), having lower or rear surface 22 and upper or front surface 23. Overlying upper surface 23 of substrate 21 is semiconductor (SC) layer 24, for example of gallium nitride (GaN), having upper or front surface 25. On surface 25 above portion 21-1 of substrate 21 are located, in this example, Ohmic source-drain contacts 26, 27 overlain by conductors 28, 29, respectively, and junction gate 30; thereby forming field-effect transistor (FET) 32. SC layer 24 has thickness 24-1 proximate device 32 and slightly smaller thickness 24-2 in the vicinity of TSV 40. Overlying surface 25 of SC layer 24 and junction gate 30 is dielectric layer 34, for example of silicon nitride. Shield conductor 36 overlies junction gate 30 but is electrically isolated therefrom by portion 341 of dielectric layer 34. In this example shield conductor 36 is electrically coupled to source contact 26.

Through-substrate via (TSV) 40 is located in portion 21-2 of substrate 21. In this example, SC layer 24 and dielectric layer 34 extend over substrate portion 21-2. On rear surface 22 of substrate 21 is conductor 39 with portion 39-1 on rear surface portion 22-1 and portions 39-2, 39-3 extending into through-substrate via 40. Portion 39-3 of conductor 39 extends through SC layer 24 and dielectric layer 34 in through-substrate via 40 so as to make electrical contact to the underside or lower face of front surface conductor 38. Front surface conductor 38 is coupled (by means not shown in FIG. 1) to those other conductors or contacts of device 32 or other elements on or overlying upper surface 23 that need low resistance electrical contact to rear surface conductor 39 of device 21.

It is customary in the prior art to form through-substrate via 40 by etching through substrate 21 from rear surface or face 22 after formation of front surface conductor 38. Conductor 38 is often referred to as a "catch-pad", that is, an electrode (e.g., a "pad") whose underside is exposed but not destroyed or holed during etching of via 40, so that it can be contacted (e.g., "caught") by subsequently applied conductor 39. Depending upon the relative chemical properties and thicknesses of SC layer 24, dielectric layer 34, substrate 21, and conductor 38, this process has been performed with adequate manufacturing yield in the prior art where comparatively thick (e.g., about ≥1 micrometer) SC layers 24 were used. Such thicker SC layers permitted a switch of etching reagent from that used for etching through substrate 21 to another etching reagent suitable for etching through the remainder of 24 and dielectric 34 without significantly attacking front surface catch-pad conductor 38 (e.g., of Au). However, as SC layer 24 is made thinner (e.g., see layer 33 of FIG. 2) so as to permit device 20', 32 to achieve improved electrical performance, the via-etch process can no longer be reliably stopped to permit such change in etchant, with the result that the etchant for substrate 21 to form TSV 40 carries on through SC layer 33, dielectric 34 and all too often also etches through or substantially damages front surface catch-pad conductor 38.

FIG. 2 shows a simplified cross-sectional view of a modified version 20' of device 20 of FIG. 1 wherein SC layer 33 has been made thinner than SC layer 24 of FIG. 1. SC layer 33 has thickness 33-1 proximate device 32 and thickness 32-2 in the vicinity of TSV 40. Typically thickness 33-2 is about 0.2-0.3 micrometers smaller than thickness 33-1 in order to facilitate isolation of device 32 from other devices on substrate 21. Thus, as thickness 33-1 is made smaller in order to obtain improved device properties, thickness 33-2 of SC layer 33 in the vicinity of catch pad 38' also decreases in thickness, exacerbating the manufacturing problem noted above. FIG. 2 illustrates via etching failure during manufacturing wherein front surface catch-pad conductor 38' has been penetrated. When rear surface conductor 39 (not shown) is applied to the structure illustrated in FIG. 2, electrical connection between rear surface conductor 39 and front surface catch-pad conductor 38' is often no longer adequate or reliable. Accordingly, a structure and manufacturing method that avoids this difficulty is much needed.

FIG. 3 shows a simplified cross-sectional view of improved semiconductor device 50 employing through-substrate via (TSV) 70, according to an embodiment of the present invention. Where various regions or layers of FIG. 3 are substantially analogous to those shown in FIG. 1 or 2, the same reference numbers are used. Device 50 has substrate 21 (e.g., SiC) with portions 21-1, 21-2, lower surface 22 and upper surface 23. SC layer 44 (e.g., of GaN) overlies upper surface 23 of substrate 21 and has upper surface 45 and thickness 44-1 proximate device 52 and thickness 44-2 proximate TSV 70. Thickness 44-1 is usefully in the range of about 0.2 to 15 micrometers, more conveniently in the range of about 0.2 to 5 micrometers, and preferably about 0.2 to 0.5 micrometers, but thicker and thinner layers and other semiconductors can also be used. Thickness 44-2 is generally about 0.2-0.3 micrometers smaller than thickness 44-1, but other thicknesses including zero thickness can also be used for thickness 44-2. Device 50 includes, by way of example and not intended to be limiting, FET device 52 comprising Ohmic source-drain contacts 26, 27 with overlying conductors 28, 29, respectively, and junction gate 30 In a preferred embodiment, device 50 also includes front surface catch-pad conductor 58 over portion 21-2 of substrate 21, analogous to front surface catch-pad conductor 38 of FIG. 1.

Overlying SC layer 44 and junction gate 30 is dielectric (e.g., silicon nitride) layer 34 of thickness 35. Thickness 35 is usefully in the range of about 0.01 to 10 micrometers, more conveniently in the range of about 0.05 to 2 micrometers, and preferably about 0.5 micrometers, but thicker and thinner layers and other dielectrics can also be used. Portion 341 of dielectric layer 34 lies between junction gate 30 and gate shield conductor 76. In a preferred embodiment, gate shield conductor 76 is formed from portion 56-1 of common conductor layer 56. Portions 39-2, 39-3 of rear or lower surface conductor 39 extend into through-substrate via 70 and make contact to front surface catch-pad conductor 58 via etch stop portion 56-2 of common conductor layer 56. As is explained in more detail in connection with FIGS. 6-12 it has been found that in a preferred embodiment, manufacturing efficiency is improved and manufacturing cost reduced by making gate shield conductor 76, 56-1 and etch stop portion 56-2 during the same manufacturing step and of the same material, that is, as portions of common conductor layer 56. Accordingly, in a preferred embodiment, gate shield portion 56-1 and etch stop portion 56-2 are collectively referred to as being part of common conductor layer 56, Common conductor layer 56 is also referred to as "etch stop" layer 56 (e.g., see FIGS. 4-5) because of its important function in connection with front surface catch pad conductor 58. In other embodiments, different materials may be used for gate shield conductor 76 and etch stop portion 56-2. In the example of FIG. 3, conductor 58 is shown as overlying etch stop portion 56-2 above the location of through-substrate via 70 thereby providing electrical continuity between conductors 39 and 58. This arrangement is preferred. However, in other embodiments, while etch stop portion 56-2 is still placed above the location of through-substrate via 70 so that etching can be conveniently stopped once substrate 21 has been penetrated by via 70, conductor 58 may be laterally located elsewhere since it need not overlie through-substrate via 70. As long as conductor 58 is electrically coupled to etch stop portion 56-2 in some location and in some manner, the desired electrical continuity is obtained between conductors 58 and 39.

Figure 4:
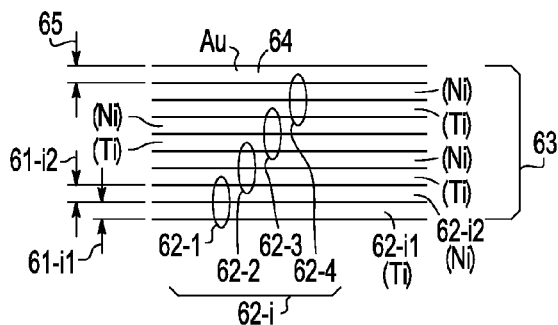
FIGS. 4-5 show simplified cross-sectional views of portions of the device of FIG. 3 much enlarged and showing further details, according to further embodiments of the present invention.
Figure 5:
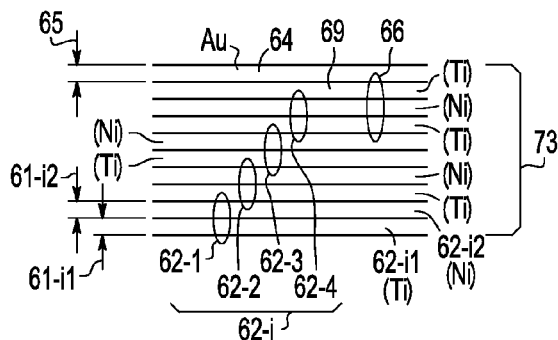

FIGS. 4-5 show simplified cross-sectional views of layer 56 of device 50 of FIG. 3 much enlarged and showing additional detail, according to other embodiments of the present invention. Referring now to FIG. 4 illustrating one embodiment, layer 56 is provided by stack 63 comprising one or more multi-layers 62-1, 62-2, 62-3, 62-4, etc., of conductors of different etch and stress relief and/or adhesion properties. Reference number 62-$i$ where i=1, 2, 3, etc., is used to refer generally to such multi-layers. In a preferred embodiment, each of multi-layers 62-$i$ is a double-layer comprising first or lower sub-layer 62-$i$1 of thickness 61-$i$1 of, for example titanium (Ti), surmounted by second or upper sub-layer 62-$i$2 of thickness 61-$i$2 of, for example nickel (Ni), where i=1, 2, 3, etc. In a preferred embodiment, stack 63 is capped by layer 64. Layer 64 is preferably of Au to minimize formation of surface oxides or other corrosion products prior to front surface conductor 58 being formed over stack 63, but other generally corrosion resistance materials may also be used. In yet other embodiments, layer 64 may be omitted. Multi-layer stack 63 comprises one or more multi-layers 62-$i$ where i=1, 2, . . . N. In the example of FIG. 4, stack 63 shows four multi-layers 62-$i$, that is for N=4, however this is intended merely as an illustrative example and any number N≥1 of multi-layers 62-$i$ may be used in stack 63 and preferably N≥2.

Referring now to FIG. 5, illustrating another embodiment, layer 56 is provided by stack 73 comprising one or more multi-layers 62-1 . . . 62-N such as have been described above, with further adhesion promoting (e.g. Ti) layer 69 inserted between multi-layer 62-N and overlying corrosion resistant (e.g., Au) layer 64 discussed above. Stated another way, in stack 73 of FIG. 5 the upper-most multi-layer, e.g., layer 62-N, is replaced by triple (e.g., Ti—Ni—Ti) layer 66 with (e.g., Ti) layer 69 uppermost in contact with overlying corrosion resistant (e.g., Au) layer 64 when present. The purpose of layer 69 is to increase the adhesion of whatever overlies layer 69, e.g., layer 64 if present or front surface catch-pad conductor 58 if layer 64 is omitted. Any number of multi-layers 62-$i$ may be used in stack 73 provided that upper multi-layer 62-N corresponds to triple-layer 66 illustrated here or equivalent.

In the foregoing discussions of FIGS. 3-5, etch-stop layer 56 has been illustrated by use of Ti and Ni, wherein the Ni provides the desired etch-stop function and Ti improves adhesion to underlying or overlying layers and compensates for the stress that would otherwise be introduced by use of Ni alone. However, the choice of materials for sub-layer 62-$i$1 (preferably a stress compensation and/or adhesion promoting material) and sub-layer 62-$i$2 (preferably an etch-resistant material) will depend upon the choice of material for substrate 21 and the choice of material for SC layer 24 (and in some cases also the choice of material for dielectric layer 34) and the various etching reagents intended to be used. Accordingly, the material used in sub-layer 62-$i$1 is more generally identified as a stress compensation and/or adhesion promoting material, and the material used in sub-layer 62-$i$2 is more generally identified as an etch resistant material, without reference to particular elements or compounds. As used in this context, the term "etch resistant" refers to the ability of such material or sub-layer to resist the etchants used to etch via 70 through substrate 21 and any overlying layers between substrate 21 and front surface catch-pad conductor 58. While it is preferred to have sub-layer 62$i$-1 of multi-layer 62-$i$ face toward via 70 and sub-layer 62-$i$2 face toward upper surface catch-pad conductor 58, the order of such sub-layers may be interchanged in additional embodiments.

Where substrate 21 is of SiC, SC 24 is of GaN and dielectric layer 34 is of silicon nitride, stress compensation and/or adhesion promoting sub-layer 62-$i$1 of multi-layers 62-$i$ is usefully of Ti, Cr, Ta or combinations thereof, with Ti being preferred, and etch resistant sub-layer 62-$i$2 of multi-layers 62-$i$ is usefully of Ni, Al, indium-tin (In—Sn) oxide or combinations thereof, with Ni being preferred, but other electrically conductive materials of appropriate stress compensation, adhesion and etch resistant properties can also be used. In a preferred embodiment using i=1, 2, 3, . . . N multi-layer pairs 62-$i$ using Ti and Ni sub-layers: (i) Ti sub-layers 62-$i$1 have thickness 61-$i$1 usefully in the range of about 10 to 100 nanometers thick, more conveniently in the range of about 20 to 70 nanometers thick and preferably about 20 to 50 nanometers thick, and (ii) Ni sub-layers 62-$i$2 have thickness 61-$i$2 usefully in the range of about 50 to 200 nanometers thick, more conveniently in the range of about 70 to 150 nanometers thick and preferably about 100 nanometers thick, in either order, but thicker and thinner layers and other materials may also be used. In various embodiments, different multi-layer pairs 62-$i$, i=1, 2, 3, etc., may have different sub-layer thicknesses 61-$i$1, 61-$i$2, i=1, 2, 3, etc. Stated another way, it is useful to use 1 to 10 multi-layer pairs 62-$i$, better 2 to 10 multilayer pairs, more conveniently about 3 to 6 multi-layer pairs 62-$i$ and preferably about 4 multilayer pairs 62-$i$ having individual layer thicknesses 61-$i$1, 61-$i$2 in the ranges given above, but larger or smaller numbers of layers can also be used. Stated still another way, it is useful to have the total combined thickness of the etch resistant sub-layers 62-$i$2 be in the range of about 200 to 1,000 nanometers, more conveniently in the range of about 300 to 800 nanometers and preferably about 400 to 600 nanometers, but larger or smaller values can also be used. Persons of skill in the art will understand how to choose appropriate materials for use in sub-layers 62-$i$1 and 62-$i$2 of multi-layers 62-$i$ depending upon the materials being used for substrate 21, SC layer 24, dielectric layer 34 and front side catch-pad conductor 58, and the method of etch selected (e.g., wet chemical etching, dry plasma etching, reactive ion etching, combinations thereof, etc., and the reagents used therein). It is important that the materials of multi-layers 62-$i$ be electrically conductive since they are located between overlying front surface catch-pad conductor 58 and portion 39-3 of conductor 39 extending from rear face 22 of substrate 21 into substrate via 70. If insulating or semi-insulating materials are used in multi-layers 62-$i$, then the electrical (and/or thermal) resistance between front and rear faces of device 50 may be greater than is desired.

Referring again to FIGS. 3-5, in a preferred embodiment wherein substrate 21 is of SiC, SC layer 44 is of GaN and dielectric layer 34 is of silicon nitride, then: (i) thickness 61-$i$1 of (e.g., Ti) sub-layer 62-$i$1 of multi-layer 62-$i$ is usefully in the range of about 1 to 200 nanometers, more conveniently in the range of about 10 to 100 nanometers and preferably about 50 nanometers, and (ii) thickness 61-$i$2 of (e.g., Ni) sub-layer 62-$i$2 of multi-layer 62-$i$ is usefully in the range of about 10 to 1000 nanometers, more conveniently in the range of about 50 to 200 nanometers and preferably about 100 nanometers, and (iii) thickness 65 of (e.g., Au) layer 64 is usefully in the range of about 2 to 2000 nanometers, more conveniently in the range of about 5 to 100 nanometers and preferably about 50 nanometers, but smaller and larger thicknesses may also be used for these various layers. In preferred embodiments, N=4 is useful, but thinner and thicker stacks 63, 73 may also be used for layer 56. Back-side conductor 39 is conveniently of Au, Al, Cu, or combinations thereof, with Au being preferred, and of thickness usefully in the range of about 0.1 to 20 micrometers, more conveniently in the range of about 1 to 10 micrometers and preferably about 5 micrometers, but other conductive materials and thicker and thinner layers can also be used.

FIGS. 6-12 show simplified cross-sectional views of device 50 of FIG. 3 employing layer 56 of FIGS. 4-5 during various stages 106-112 of manufacture, according to still further embodiments of the present invention, and illustrating resulting structures 206-212. The custom is followed of initially adding a prime (') to identify reference numbers of various elements or regions that ultimately appear in finished device 50 of FIG. 3, but whose initial form (e.g., thickness) is different than in finished device 50. For example, reference number 21' is used to identify the initial substrate with initial lower surface 22' to indicate that initial substrate 21' and initial lower surface 22' are modified during the course of manufacture to provide finished device 50 comprising final substrate 21 with final lower surface 22 (e.g., by reducing initial thickness 80). In the description of manufacturing stages 106-112, formation of only single FET device 52 is shown, but persons of skill in the art will understand that this is merely for convenience of explanation and is not intended to be limiting, and that any number of active and passive devices of any kind (e.g., FETs, bipolar transistors, MOSFETs, IGFETs, JFETs, diodes, emitters, sensors and other opto-electronic devices, etc.) may be included, of which FET 52 is only intended to be a representative example. Further, the manufacturing process steps for forming such devices are well known in the art and hence are not described here. The manufacturing stages illustrated below are limited to those needed to form through substrate via 70, provide an electrical conductor therein and make electrical connection from such conductor to a front surface (e.g., catch-pad) conductor, thereby making available on the front surface of device 50 a low resistance electrical path to back-side conductor 39 which can be used by persons of skill in the art according to the needs of their particular electronic devices and circuits. The additional methodology wherein common layer 56 can also provide a shield conductor (e.g., for FET gates and analogous portions of other device types) is also shown.

Figure 6:
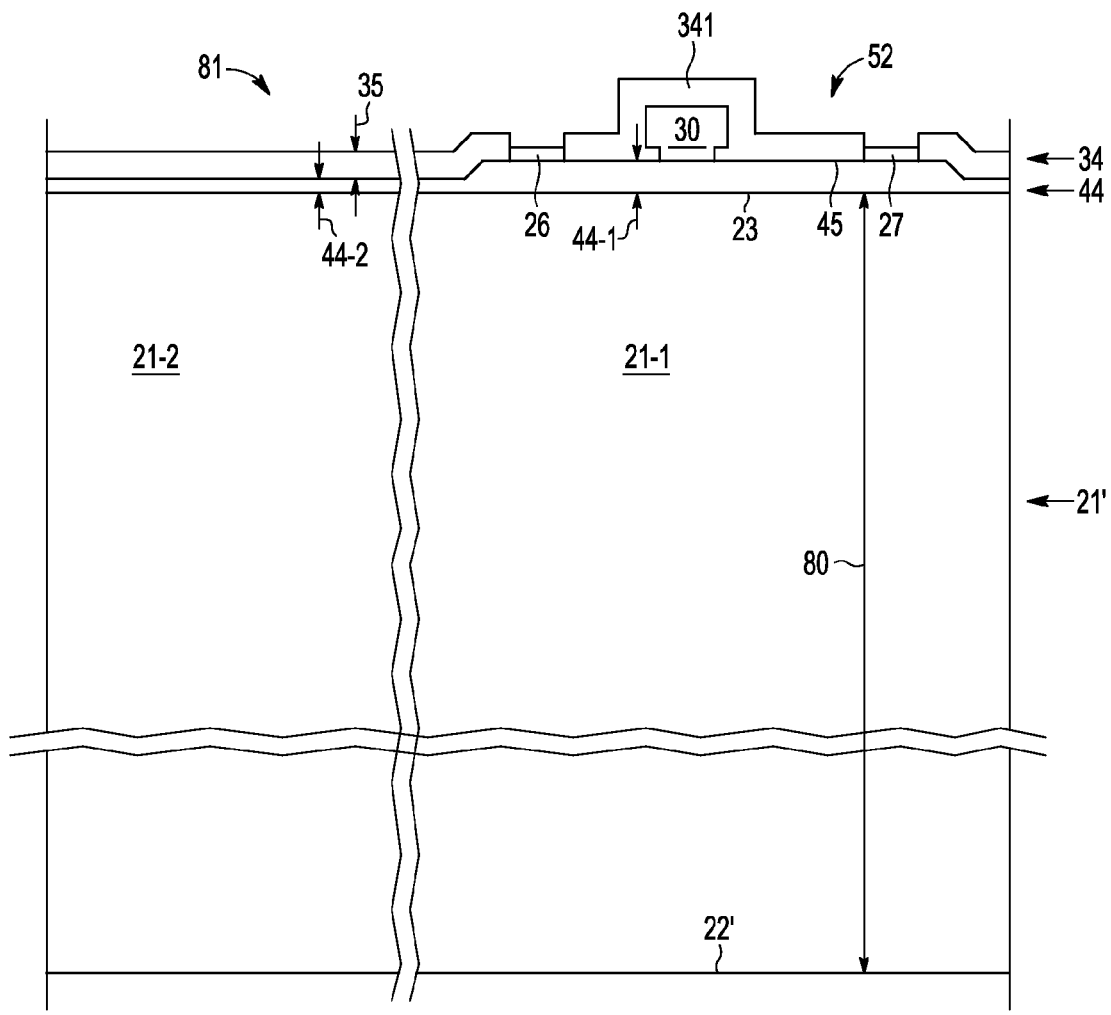
FIGS. 6-12 show simplified cross-sectional views of the device of FIGS. 3-5 during various stages of manufacture, according to still further embodiments of the present invention.

Referring now to manufacturing stage 106 of FIG. 6, substrate 21' (e.g., of SiC) is provided having initial lower surface 22', upper surface 23 and initial thickness 80. SC layer 44 with Ohmic source-drain contacts 26, 27 and junction gate 30 have already been formed on upper surface 23 of substrate 21' in the course of creating FET 52. SC layer 44 has thickness 44-1 over substrate portion 21-1 of substrate 21' proximate device 52 and thickness 44-2 over substrate portion 21-2 of substrate 21' wherein substrate via 70 will be subsequently formed. Dielectric (e.g., silicon nitride) layer 34 of thickness 35 has also been provided with portion 341 overlying junction gate 30 and those portions of SC layer 44 laterally outside of Ohmic source-drain contacts 26, 27. In a preferred embodiment, SC layer 44 and dielectric layer 34 extend laterally over surface 23 onto portion 21-2 of substrate 21', but in other embodiments, such extension onto portion 21-2 may be omitted. Where device 52 is intended to be a FET, thickness 44-1 is usefully in the range of about 0.2 to 15 micrometers, more conveniently in the range of about 0.2 to 5 micrometers, and preferably about 0.2 to 0.5 micrometers, but thicker and thinner layers and other semiconductors can also be used. As noted earlier, thickness 44-2 is generally about 0.2 to 0.3 micrometers thinner than thickness 44-1 and may be of zero thickness. Thickness 35 has been described elsewhere. Techniques for depositing SC layer 44 and dielectric layer 34 and for forming Ohmic source-drain contacts 26, 27 and junction gate 30 and the materials useful therefore are well known in the art. Structure 206 results. Reference number 81 refers generally to the exposed upper surface of structure 206

Figure 7:
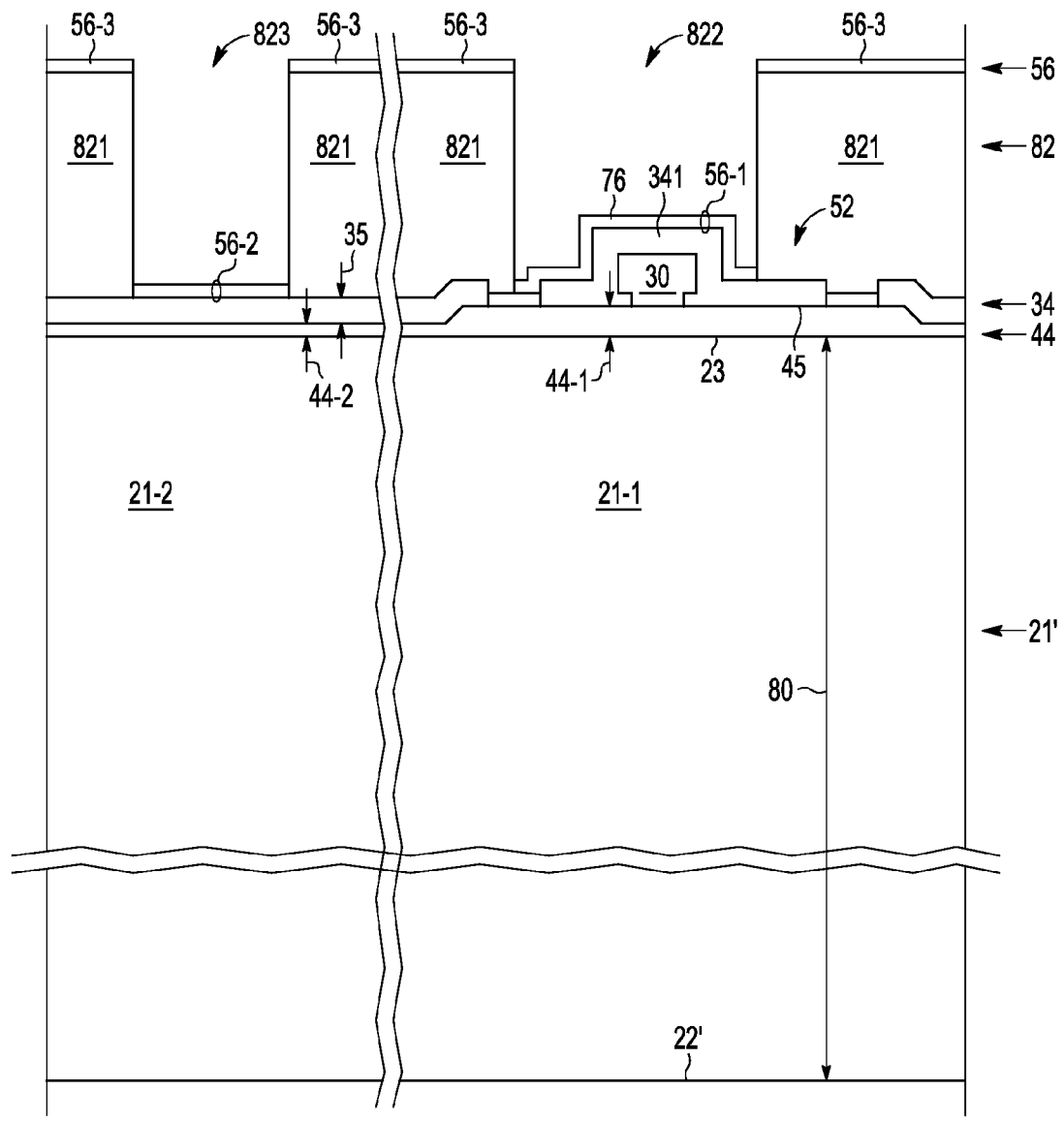

Referring now to manufacturing stage 107 of FIG. 7, mask 82 having closed portions 821 and openings 822, 823 therein is provided on exposed upper surface 81 of structure 206. Opening 822 defines the lateral extent and location of gate shield conductor 76, 56-1 and opening 823 defines the lateral extent and location of etch-stop portion 56-2 where front surface catch-pad conductor 58 will subsequently be located. Mask 82 may be a soft mask (e.g., photo-resist) or a hard mask (e.g., a refractory dielectric) depending upon the method chosen for forming layer 56. This is well known in the art. Layer 56 having the internal configuration illustrated, for example, in connection with FIGS. 4-5 and associated discussion is formed over mask 82 and into openings 822, 823. Portion 56-1 of layer 56 is formed via opening 822 and portion 56-2 is formed via openings 823. Vacuum evaporation or sputtering or plasma assisted chemical vapor deposition are suitable well known techniques and any or combinations thereof may be used for forming layer 56. Vacuum evaporation is preferred. Structure 207 results.

Figure 8:
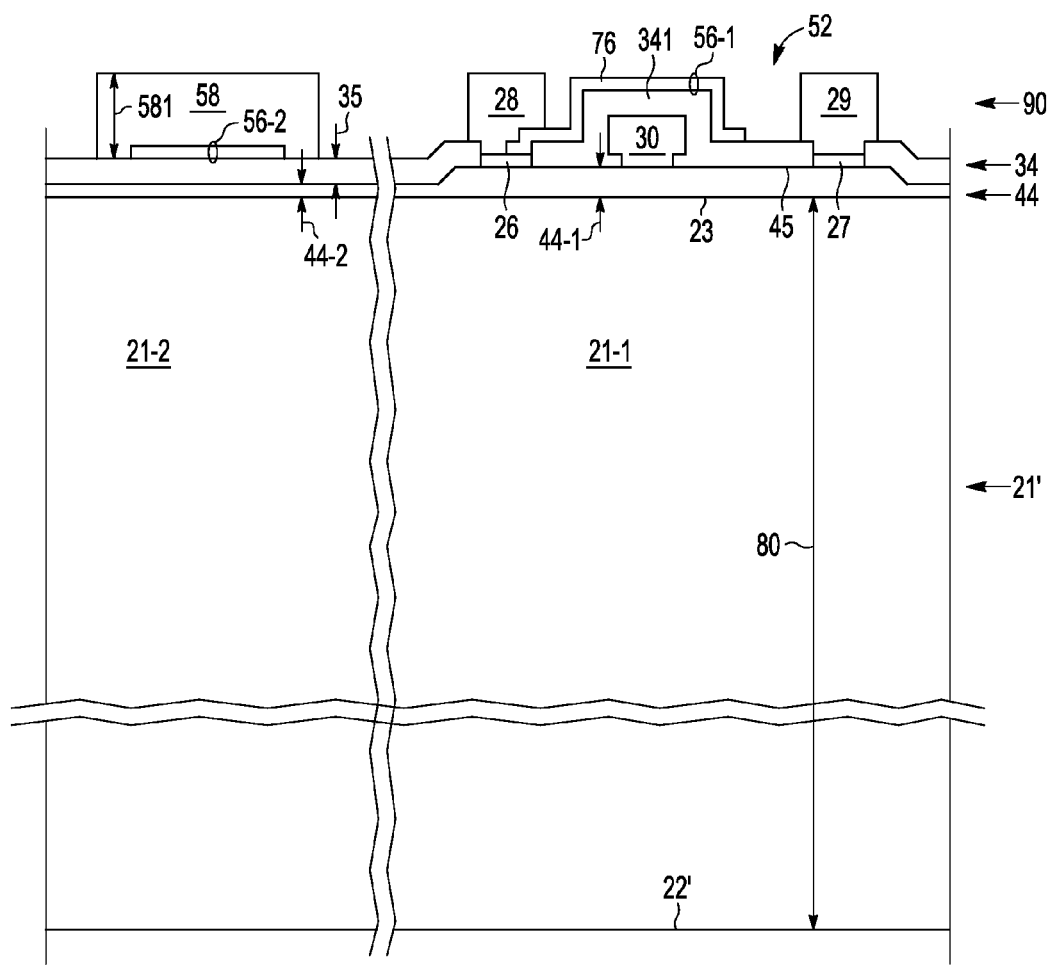

Referring now to manufacturing stage 108 of FIG. 8, mask 82 along with those portions of layer 56 lying on closed mask portions 821 are removed, for example, by dissolving away or lifting off mask 82, leaving etch-stop portion 56-2 and, in a preferred embodiment, gate shield portion 56-1 of layer 56. While the above-described means for forming conductor portions 56-1, 56-2 is preferred, any other means for providing an equivalent structure may be used in still other embodiments. A further mask (not shown) is applied and used to control the lateral extent and location of conductor layer 90 which is used to form front-side conductor 58, and source-drain conductors 28, 29, using means well known in the art. Non-limiting examples of suitable material for conductor layer 90 are Au, Cu, Al, and combinations thereof, with Au being preferred, but other conductors can also be used. The thickness of layer 90 and the resulting thickness of conductor regions 58, 28, 29 will depend upon the path resistance needs of the particular circuit being formed for device or integrated circuit (IC) 50. However, in view of front-side conductor 58 also serving as a catch-pad, it is desirable that front-side catch-pad conductor 58 have thickness 581 usefully in the range of about 1 to 20 micrometers, more conveniently in the range of about 2 to 10 micrometers and preferably about 4 micrometers. Structure 208 results. As noted in connection with the discussion of FIG. 3, conductor 58 need not overlie etch stop portion 56-2 in the vicinity of through-substrate via 70 (see FIG. 10), provided that it is otherwise electrically coupled to etch stop portion 56-2.

Figure 9:
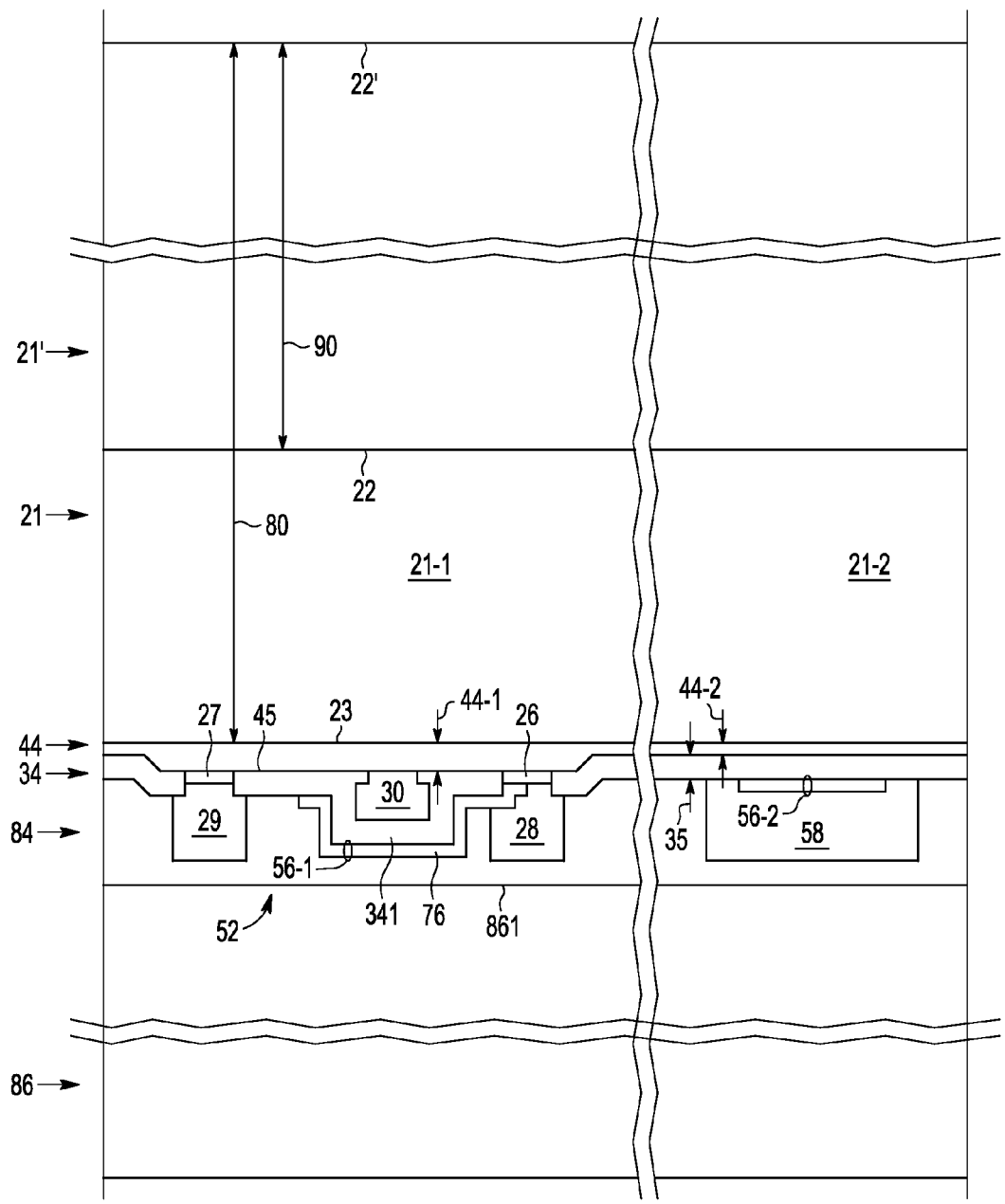

Referring now to manufacturing stage 109 of FIG. 9, structure 208 of FIG. 8 is flipped over and mounted by adhesive 84 to temporary substrate 86, commonly referred to as a "carrier." Substrate 21' of initial thickness 80 and initial back surface 22' is then reduced in thickness by amount 90 to newly expose final rear face or surface 22 of final substrate 21. Techniques for performing such thinning operations are well known in the art. Back-lapping and chemical-mechanical polishing are not-limiting examples. Structure 209 results.

Figure 10:
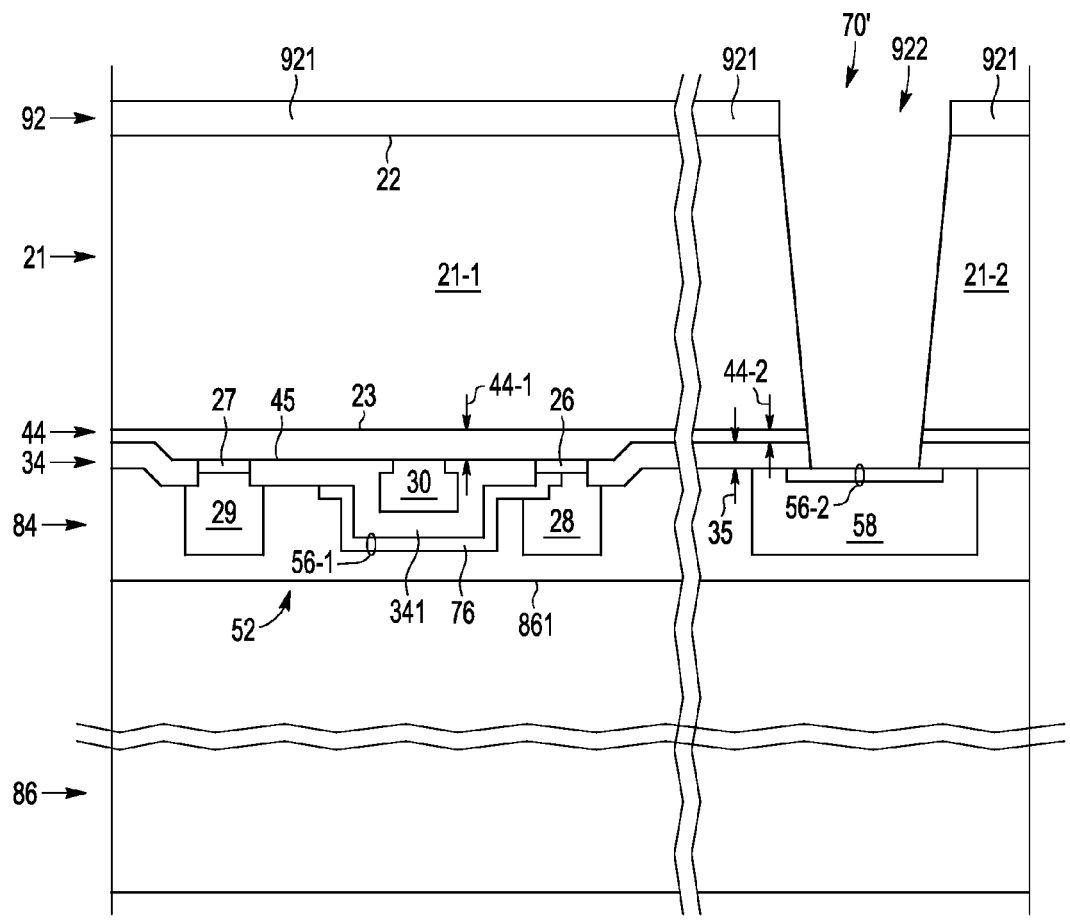

Referring now to manufacturing stage 110 of FIG. 10, structure 210 wherein device 50 still supported by carrier 86, is flipped over and mask 92 having closed portions 921 and opening 922 is applied to rear surface 22 of final substrate 21. Mask 92 is preferably a hard mask such as, for example and not intended to be limiting, of indium-tin oxide or Ni, but other materials can also be used. Opening 922 is located above portion 21-2 of substrate 21 so that when substrate via opening 70' is etched through substrate 21 and the portions of SC layer 44 and dielectric layer 34 that underlie etch-stop portion 56-2, that newly formed via opening 70' will extend to etch-stop portion 56-2. When substrate 21 is of, for example SiC and SC layer 44 is of, for example GaN, and dielectric layer 34 is of, for example silicon nitride, then plasma etching using fluorine gas is a preferred technique for forming via opening 70' extending from rear surface 22 of substrate 21, through substrate 21, and through those portions of SC layer 44 and dielectric layer 34 on substrate portion 21-2, to intersect etch stop portion 56-2 proximate or past front surface 23 of substrate 21. Plasma etching is well known in the art and suitable plasma etching equipment is available from a variety of manufacturers including Unaxis Wafer Processing Company, St. Petersburg, Fla., USA. Structure 210 results. For convenience of illustration of a preferred embodiment, it is assumed in FIGS. 10-12 and 3 that conductor 58 contacts etch stop portion 56-2 in the vicinity of through-substrate via 70, but as noted earlier, this is not essential and electrical contact between conductors 56 and 58 may be made at any convenient location and in any convenient manner.

Figure 11:
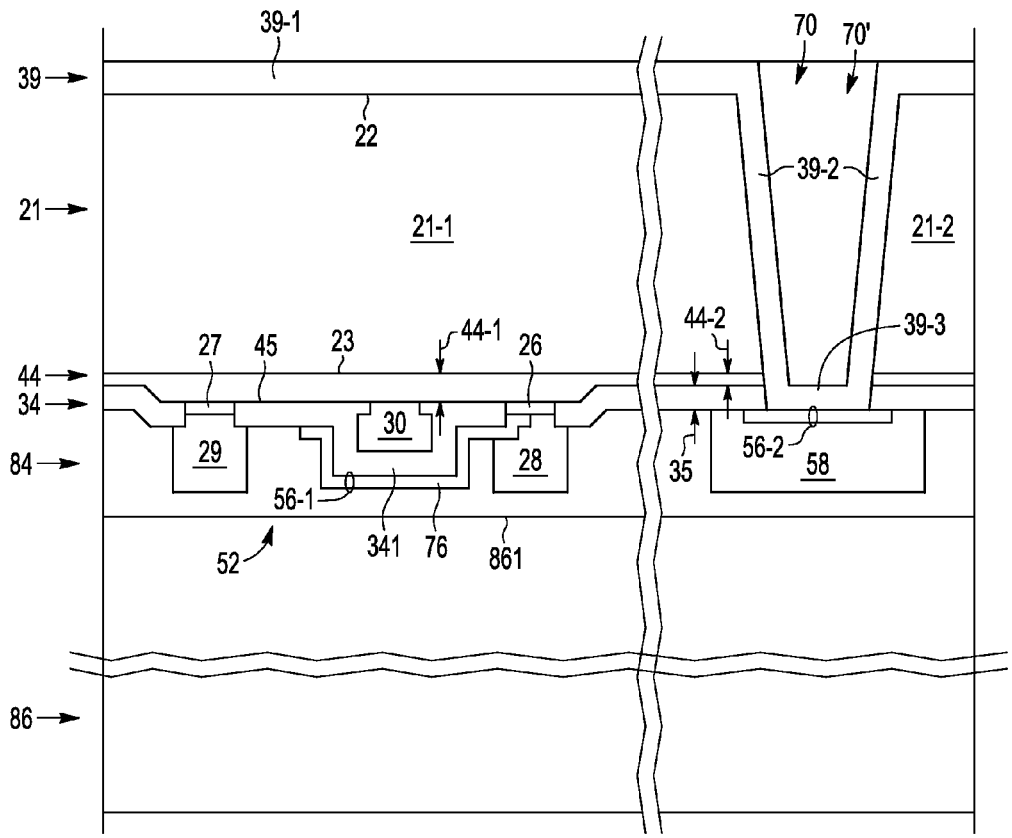
Figure 12:
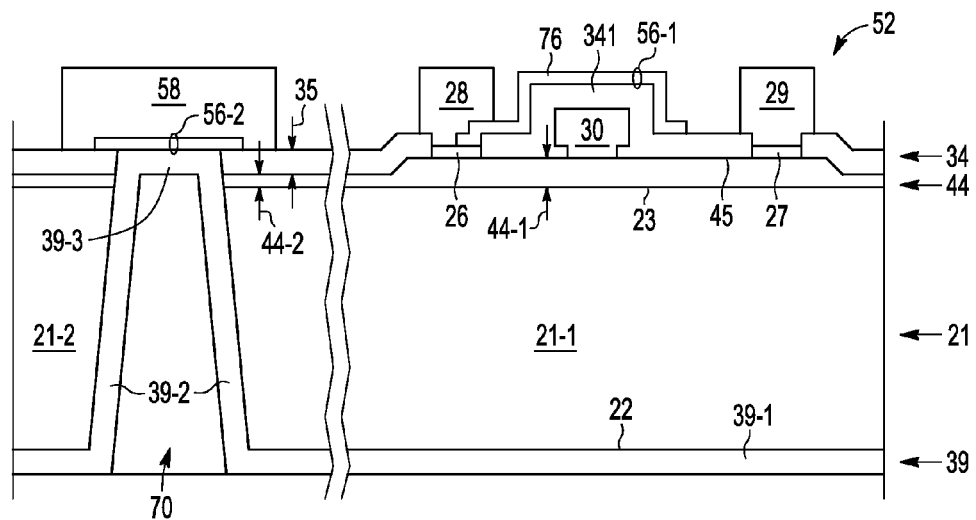

Referring now to manufacturing stage 111 of FIG. 11, structure 210 is still supported by carrier 86. Mask layer 92 of structure 210 is removed and rear surface conductor 39 formed over rear surface 22 of substrate 21, with portions 39-2, 39-3 extending into via opening 70' to thereby form through-substrate via 70 in Ohmic electrical contact with etch-stop portion 56-2 which is in turn in Ohmic electrical contact with front surface catch-pad conductor 58. Structure 211 results. Further processing my be provided while carrier 86 is still attached, such as for example, providing overlying metal interconnects (not shown) or surface dielectric layers (also not shown) using means well known in the art. Persons of skill in the art will understand what further back-end processing is needed to meet their particular requirements. Referring now to manufacturing stage 112, carrier 86 still present in structure 211 of FIG. 11 is removed by dissolving adhesive 84 of FIG. 11 or by other means. Techniques for separating substrate 21 from carrier 86 of FIG. 11 are well known in the art. Structure 212 results. Device 50 is now substantially finished.

According to a first embodiment, there is provided an electronic device (50) having a substrate (21) with a conductive through-substrate via (70) extending between a first surface (22) and a second surface (23) of the substrate (21), comprising, a front surface electrically coupled to the front surface conductor (58), wherein the multi-layered etch-stop region is resistant to an etchant that etches the substrate (21), and a via conductor (39) extending at least from the first surface (22) of the substrate (21) through the substrate (21) and making electrical contact via the multi-layered etch-stop region (56-2) to the front surface conductor (58), thereby forming the through-substrate conductive via (70). According to a further embodiment, the multi-layered etch-stop region (56-2) comprises at least a first sub-layer (62-i1) of a stress relief or adhesion promoting material and a second sub-layer (62-i2) of an etch resistant material. According to a still further embodiment, the multi-layered etch-stop region (56-2) comprises a multiplicity of layer pairs (62-i), each layer pair (62-i) comprising a first sub-layer (62-i1) of a stress relief or adhesion promoting material and a second sub-layer (62-i2) of an etch resistant material, arranged in either order. According to a yet further embodiment, the multi-layered etch-stop region (56-2) comprises a stack (63, 73) of 2≤N≤10 pairs (62-i) of sub-layers (62-i1, 62-i2), each pair (62-i) of sub-layers (62-i1, 62-i2) comprising a stress relief or adhesion promoting material sub-layer (62-i1) and an etch resistant material sub-layer (62-i2) arranged in either order. According to a still yet further embodiment, the multi-layered etch stop region lies between the front surface conductor and the second surface. According to a yet still further embodiment, the multi-layered etch-stop region (56-2) comprises a stack (63, 73) of N≥1 pairs (62-i) of sub-layers (62-i1, 62-i2), each pair (62-i) of sub-layers (62-i1, 62-i2) comprising a stress relief or adhesion promoting material sub-layer (62-i1) and an etch resistant material sub-layer (62-i2), arranged in either order, and further comprising a corrosion resistant layer (64) overlying the stack (63, 73) of N≥2 pairs (62-i) of sub-layers (62-i1, 62-i2). According to another embodiment, the device (50) further comprises an adhesion layer (69) between the stack (63, 73) of N≥2 pairs (62-i) of sub-layers (62-i1, 62-i2) and the corrosion resistant layer (64). According to a still another embodiment, the stress relief or adhesion promoting material sub-layer comprises at least one of the group consisting of titanium, chromium, tantalum, and combinations thereof, and the etch resistant material sub-layer comprises at least one of the group consisting of nickel, aluminum, indium-tin-oxide, and combinations thereof. According to a yet another embodiment, the electronic device (50) comprises a field effect transistor (32) having a gate (30) with a gate shield (76, 56-1) formed from the same material (56) as the multi-layered etch-stop region (56-2).

According to a second embodiment, there is provided a method for forming a conductive through-substrate via (70) in an electronic device (50), comprising, providing a substrate (21) having a front surface (23), forming above the front surface (23) an electrically conductive multi-layered etch-stop region (56-2) adapted to resist etchants that etch the substrate (21), forming above the front surface (23) a front surface conductor (58) in electrical contact with the multi-layered etch-stop region (56-2), etching a through-substrate via passage (70') in the substrate (21), extending from a rear surface (22) of the substrate (21) through the substrate (21) to the multi-layered etch-stop region (56-2), and forming an electrical conductor (39, 39-2, 39-3) in the through-substrate via passage (70') extending substantially from the rear surface (22) of the substrate (21) to the multi-layered etch-stop region (56-2) and making electrical contact to the front surface conductor (58) via the multi-layered etch-stop region (56-2), thereby forming the conductive through-substrate via (70). According to a further embodiment, the step of etching the through-substrate via passage (70') comprises, etching the substrate (21) using a plasma containing fluorine. According to a still further embodiment, the method further comprises prior to the etching step, mounting on a carrier (86) an initial substrate (21') from which the substrate (21) can be formed so that an initial rear face (22') of the initial substrate (21') is exposed, removing material from the initial rear face (22') thereby thinning the initial substrate (21') so as to provide the substrate (21) having a newly exposed rear face (22) from which the etching step can proceed, providing an etch resistant mask (92) on the newly exposed rear face (22) having a closed portion (921) and an open portion (922), the open portion (922) substantially defining a location of the through-substrate via passage (70'), and etching the substrate (21) through the open portion (922) to form the through-substrate via passage (70'). According to a yet further embodiment, the method further comprises, removing the etch resistant mask (92). According to a still yet further embodiment, the step of forming an electrically conductive multi-layered etch-stop region (56-2), comprises, forming a stack (63, 73) of N≥2 pairs (62-i, i=1, 2, 3, . . . N) of electrically conductive sub-layers (62-i1, 62-i-2) in either order, wherein a first (62-i1) of the electrically conductive sub-layers (62-i1, 62-i-2) is chosen from materials having stress relief or adhesion promoting properties or both, and a second (62-i2) of the electrically conductive sub-layers (62-i1, 62-i-2) is chosen from materials adapted to resist the etching step. According to a yet still further embodiment, the first (62-i1) of the conductive sublayers (62-i1, 62-i-2) comprises at least one of the group consisting of titanium, chromium, tantalum, and combinations thereof, and the second (62-i2) of the conductive sub-layers (62-i1, 62-i-2) comprises at least one of the group consisting of nickel, aluminum, indium-tin oxide, and combinations thereof. According to another embodiment, the method further comprises, forming over the front surface (23) a field effect transistor (32) having a gate (30), and during the step of forming the electrically conductive multi-layered etch-stop region (56-2), forming a gate shield (76) overlying the gate (30) from the same material (56, 56-1) used for the electrically conductive multi-layered etch-stop region (56-2).

According to a third embodiment, there is provided an electronic device (50), comprising, a substrate (21) having a first conductor (39-1) on a rear surface (22) thereof and a second conductor (58) over a front surface (23) thereof, an electrically conductive multi-layered etch-stop (56, 56-2) located between a portion of the front surface (23) of the substrate (21) and the second conductor (58), a substrate via (70') extending through the substrate (21) from the rear surface (21) thereof to the multi-layered etch-stop (56, 56-2), and a third conductor (39-2, 39-3) in the substrate via (70) electrically coupling the first conductor (39-1) to the second conductor (58) via the multi-layered etch stop (56, 56-2). According to a further embodiment, the electrically conductive multi-layered etch-stop (56, 56-2) comprises a stack of N≥2 double layers (42-i), each double layer (42-i) comprising a first sub-layer (42-i1) of an adhesion or stress relief or both promoting conductor and a second sub-layer (42-i2) of an etch resistant conductor, arranged in either order. According to a still further embodiment, the second sub-layer (42-i2) comprises at least one of the group consisting of Ni, Al, In—Sn oxide, and combinations thereof. According to a yet further embodiment, the device further comprises an oxidation resistant layer (64) between the electrically conductive multi-layered etch-stop (56, 56-2) and the second conductor.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method, comprising:
  providing a substrate having a front surface;
  forming above the front surface an electrically conductive multi-layered etch-stop region adapted to resist etchants that etch the substrate;
  forming above the front surface a front surface conductor in electrical contact with the multi-layered etch-stop region;
  etching a through-substrate via passage in the substrate, extending from a rear surface of the substrate through the substrate to the multi-layered etch-stop region; and
  forming an electrical conductor in the through-substrate via passage extending substantially from the rear surface of the substrate to the multi-layered etch-stop region and making electrical contact to the front surface conductor via the multi-layered etch-stop region, thereby forming a conductive through-substrate via.

2. The method of claim 1 wherein the step of etching the through-substrate via passage comprises etching the substrate using a plasma containing fluorine.

3. The method of claim 1 wherein the etching step further comprises:
  mounting on a carrier an initial substrate from which the substrate can be formed so that an initial rear face of the initial substrate is exposed;
  removing material from the initial rear face thereby thinning the initial substrate so as to provide the substrate having a newly exposed rear face from which the etching step can proceed;
  providing an etch resistant mask on the newly exposed rear face having a closed portion and an open portion, the open portion substantially defining a location of the through-substrate via passage; and
  etching the substrate through the open portion to form the through-substrate via passage.

4. The method of claim 3 further comprising, after the etching step, removing the etch resistant mask.

5. The method of claim 1 wherein the step of forming an electrically conductive multi-layered etch-stop region comprises:
  forming a stack of N≥2 pairs of electrically conductive sub-layers in either order, wherein a first of the electrically conductive sub-layers is chosen from materials having stress relief or adhesion promoting properties or both, and a second of the electrically conductive sub-layers is chosen from materials adapted to resist the etching step.

6. The method of claim 5 wherein the first of the conductive sub-layers comprises at least one of the group consisting of titanium, chromium, tantalum, and combinations thereof, and the second of the conductive sub-layers comprises at least one of the group consisting of nickel, aluminum, indium-tin oxide, and combinations thereof.

7. The method of claim 1 further comprising:
  forming over the front surface a field effect transistor having a gate; and
  forming a gate shield overlying the gate.

8. The method of claim 7 wherein the gate shield and the electrically conductive multi-layered etch-stop region are formed from the same material.

9. The method of claim 7 wherein the gate shield and the electrically conductive multi-layered etch-stop region are formed by depositing and patterning a common conductor layer.

10. The method of claim 1 wherein at least a portion of the multi-layered etch-stop region is formed within the front surface conductor.

11. A method, comprising:
  providing a substrate having a first surface and a second surface;
  etching a through-substrate via passage in the substrate utilizing a first etchant, the through-substrate via passage extending from the first surface to the second surface;
  depositing an electrical conductor in the through-substrate via passage to produce conductive through-substrate via.

forming a front surface conductor above the second surface;

forming a multi-layered etch-stop region electrically coupled to the front surface conductor, the multi-layered etch-stop region comprising a material resistant to the first etchant utilized to etch the substrate, the multi-layered etch-stop region including at least one layer pair comprising:
  a first sub-layer of a stress relief or adhesion promoting material; and
  a second sub-layer of an etch resistant material formed in contact with the fist sub-layer of stress relief or adhesion promoting material.

12. A method, comprising:
providing a substrate having an upper surface and a lower surface, a semiconductor layer formed over the upper surface of the substrate, and a dielectric layer formed over the semiconductor layer;
forming a catch-pad conductor over the dielectric layer;
forming a multi-layered etch-stop region over the dielectric layer and electrically coupled to the catch-pad conductor; and
forming a through-substrate via extending from the lower surface of the substrate, through the semiconductor layer, through the dielectric layer, and to the multi-layered etch stop region, the through-substrate via electrically coupled to the catch-pad conductor through the multi-layered etch stop region.

13. The method of claim 12 wherein forming a through-substrate via comprises:
etching a through-substrate via passage in the substrate utilizing a first etchant, the through-substrate via passage extending from the lower surface, through the substrate, to the multi-layered etch-stop region; and
depositing an electrical conductor in the through-substrate via passage to form the conductive through-substrate via.

14. The method of claim 13 wherein the multi-layered etch-stop region comprises multiple layers of an etch resistant material having lower etch rate than does the substrate when exposed to the first etchant.

15. The method of claim 14 wherein the semiconductor layer comprises gallium nitride, wherein the dielectric layer comprises silicon nitride, and wherein the etch resistant material is selected form the group consisting of nickel, aluminum, indium-tin oxide, and combinations thereof.

16. The method of claim 12 wherein the multi-layered etch-stop region comprises multiple layers of a stress relief or adhesion promoting material.

17. The method of claim 16 wherein the semiconductor layer comprises gallium nitride, wherein the dielectric layer comprises silicon nitride, and wherein the stress relief or adhesion promoting material is selected from the group consisting of titanium, chromium, tantalum, and combinations thereof.

18. The method of claim 12 wherein the multi-layered etch-stop region comprises:
  at least two etch resistant layers; and
  at least one layer of a stress relief or adhesion promoting material interspersed with the at least two etch resistant layers.

19. The method of claim 12 wherein the multi-layered etch-stop region comprises:
  at least one layer pair comprising a first layer of an etch resistant material and a second layer of a stress relief or adhesion promoting material; and
  a capping layer formed over the at least one layer pair.

20. The method of claim 12 wherein the catch-pad conductor has a width greater than the width of the through-substrate via, as taken along the upper surface of the substrate.

* * * * *